(12) United States Patent
Campbell et al.

(10) Patent No.: US 9,907,211 B2
(45) Date of Patent: Feb. 27, 2018

(54) LOCKING LOUVER ASSEMBLY FOR AIR-MOVING ASSEMBLY

(71) Applicant: INTERNATIONAL BUSINESS MACHINES CORPORATION, Armonk, NY (US)

(72) Inventors: Levi A. Campbell, Poughkeepsie, NY (US); Christopher R. Ciraulo, Wappingers Falls, NY (US); Milnes P. David, Fishkill, NY (US); Dustin W. Demetriou, Poughkeepsie, NY (US); Robert K. Mullady, Poughkeepsie, NY (US); Roger R. Schmidt, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 452 days.

(21) Appl. No.: 14/499,387

(22) Filed: Sep. 29, 2014

(65) Prior Publication Data

US 2016/0095257 A1 Mar. 31, 2016

(51) Int. Cl.
*H05K 7/20* (2006.01)
*F04D 25/14* (2006.01)

(52) U.S. Cl.
CPC ......... *H05K 7/20727* (2013.01); *F04D 25/14* (2013.01); *H05K 7/2019* (2013.01); *H05K 7/20181* (2013.01)

(58) Field of Classification Search
CPC ............. H05K 1/0209; H05K 7/20181; H05K 7/20581; H05K 7/20727; H05K 7/20145;
(Continued)

(56) References Cited

U.S. PATENT DOCUMENTS 2,849,806 A 9/1958 Grahek
5,562,410 A 10/1996 Sach et al.
(Continued)

FOREIGN PATENT DOCUMENTS

CN 2907195 Y 5/2007
CN 203098342 U 7/2013
(Continued)

OTHER PUBLICATIONS

Campbell, Levi A., "Locking Louver Assembly for Air-Moving Assembly", U.S. Appl. No. 14/831,073, filed Aug. 20, 2015 (31 pages).

(Continued)

*Primary Examiner* — Len Tran
*Assistant Examiner* — Hans Weiland
(74) *Attorney, Agent, or Firm* — Steven Chiu, Esq.; Kevin P. Radigan, Esq.; Heslin Rothenberg Farley & Mesitic P.C.

(57) ABSTRACT

Apparatuses and methods are provided for locking an air-moving assembly within a chassis when in operational state. The apparatus includes a locking louver assembly having a louver(s) and locking mechanism. The louver(s) is disposed at an air inlet or outlet of the air-moving assembly, and pivots between operational and quiesced orientations, dependent on presence or absence, respectively, of airflow through the air-moving assembly. The locking mechanism includes a keying element(s) affixed to the louver(s) to pivot therewith, which includes an elongated key(s) oriented in a first direction when the louver(s) is in operational orientation, and a second direction when in quiesced orientation. A key-receiving element(s) is associated with the chassis and includes a key opening(s) which receives and accommodates movement of the elongated key(s) between the first and second directions, and prevents removal of the air-moving (Continued)

assembly from the chassis with the key(s) oriented in the first direction.

19 Claims, 12 Drawing Sheets

(58) Field of Classification Search
CPC ............ H05K 7/20172; H05K 7/2019; H05K 7/20718; H05K 7/20736; H05K 7/20836; F16K 15/035; F16K 15/06; F24F 13/14; F24F 13/1413; F24F 13/142; F24F 13/1486; F24F 2221/32; F04D 25/14
See application file for complete search history.

(56) References Cited

U.S. PATENT DOCUMENTS

| | | | |
|---|---|---|---|
| 6,005,770 A | 12/1999 | Schmitt | |
| 6,075,698 A | 6/2000 | Hogan et al. | |
| 6,115,250 A | 9/2000 | Schmitt | |
| 6,663,461 B2 | 12/2003 | Fong | |
| 6,710,240 B1 * | 3/2004 | Chen | H05K 7/20145 174/135 |
| 6,711,013 B2 | 3/2004 | Wobig et al. | |
| 6,714,411 B2 | 3/2004 | Thompson et al. | |
| 6,817,889 B2 | 11/2004 | Chang et al. | |
| 6,947,281 B2 | 9/2005 | Wrycraft et al. | |
| 7,033,206 B2 | 4/2006 | Chang et al. | |
| 7,357,708 B2 | 4/2008 | Lee | |
| 7,800,902 B2 * | 9/2010 | Della Fiora | H05K 7/20145 361/679.48 |
| 8,056,990 B2 | 11/2011 | Ye | |
| 8,320,121 B2 | 11/2012 | Bisson et al. | |
| 8,425,286 B2 | 4/2013 | Coster et al. | |
| 9,247,673 B2 | 1/2016 | Kelaher et al. | |
| 9,568,011 B2 | 2/2017 | David et al. | |
| 2002/0141879 A1 | 10/2002 | Winkel et al. | |
| 2005/0113015 A1 * | 5/2005 | Crippen | H05K 7/2019 454/184 |
| 2008/0123280 A1 | 5/2008 | Chen et al. | |
| 2008/0280552 A1 * | 11/2008 | Baker | H05K 7/20172 454/229 |
| 2012/0138262 A1 * | 6/2012 | Zhang | F04D 25/0613 165/67 |
| 2013/0160984 A1 * | 6/2013 | Cash | H05K 7/20736 165/200 |
| 2013/0323044 A1 | 12/2013 | Sun | |
| 2016/0081220 A1 | 3/2016 | Chia et al. | |

FOREIGN PATENT DOCUMENTS

| | | |
|---|---|---|
| CN | 203759638 U | 8/2014 |
| GB | 1 377 387 | 12/1974 |
| JP | 10126079 A | 5/1998 |
| JP | 2002-164681 A | 6/2002 |
| JP | 2006-344661 A | 12/2006 |
| JP | 2008-17099 A | 7/2008 |

OTHER PUBLICATIONS

Campbell, Levi A., "Protective Louver Assembly for Air-Moving Assembly", U.S. Appl. No. 14/499,402, filed Sep. 29, 2014 (34 pages).
Campbell, Levi A., "Protective Louver Assembly for Air-Moving Assembly", U.S. Appl. No. 14/831,090, filed Aug. 20, 2015 (30 pages).
Campbell, Levi A., "Interlock Assembly for Air-Moving Assembly", U.S. Appl. No. 14/499,422, filed Sep. 29, 2014 (36 pages).
Campbell, Levi A., "Interlock Assembly for Air-Moving Assembly", U.S. Appl. No. 14/831,105, filed Aug. 20, 2015 (33 pages).
Campbell, Levi A., "List of IBM Patents and/or Patent Applications Treated as Related", U.S. Appl. No. 14/499,387, filed Sep. 29, 2014, dated Mar. 11, 2016 (2 pages).
Campbell et al., "Locking Louver Assembly for Air-Moving Assembly", U.S. Appl. No. 14/499,387, filed Sep. 29, 2014 (35 pages).
Campbell et al., "Protective Louver Assembly for Air-Moving Assembly", U.S. Appl. No. 14/499,402, filed Sep. 29, 2014 (34 pages).
Campbell et al., "Interlock Assembly for Air-Moving Assembly", U.S. Appl. No. 14/499,422, filed Sep. 29, 2014 (36 pages).
Campbell et al., Notice of Allowance for U.S. Appl. No. 14/831,105, filed Aug. 20, 2015 (U.S. Patent Publication No. 2016/0095263 A1) dated Dec. 12, 2016 (9 Pages).
Campbell et al., Notice of Allowance for U.S. Appl. No. 14/499,422, filed Sep. 29, 2014 (U.S. Patent Publication No. 2016-0095261 A1), dated Jan. 6, 2014, (9 Pages).
Campbell et al., Office Action for U.S. Appl. No. 14/499,402, filed Sep. 29, 2014 (U.S. Patent Publication No. 2016/0095258 A1), dated Mar. 6, 2017 (23 pages).
Campbell et al., Final Office Action for U.S. Appl. No. 14/499,402, filed Sep. 29, 2014 (U.S. Patent Publication No. 2016/0095258 A1), dated Jun. 27, 2017 (13 pages).
Campbell et al., Office Action for U.S. Appl. No. 14/831,073, filed Aug. 30, 2015 (U.S. Patent Publication No. 2016/0095259 A1), dated Jul. 11, 2017 (14 pages).

* cited by examiner

LOCKING LOUVER ASSEMBLY FOR AIR-MOVING ASSEMBLY

BACKGROUND

In many server applications, processors along with their associated electronics (e.g., memory, disk drives, power supplies, etc.) are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack, including the electronic subsystems thereof. As one solution, a cooling apparatus may be provided which includes one or more air-moving assemblies (e.g., axial fans or centrifugal fans) which facilitate moving an airflow through the electronics rack, usually front-to-back.

In certain implementations, multiple air-moving assemblies may be provided in association with a drawer or electronics subsystem in order that the assemblies may be concurrently maintainable, such that if one fails, the failure does not stop airflow through the electronics subsystem, and thus negatively affect operational availability of computing resources to the customer. In the event that an operating air-moving assembly is mistakenly removed, the fan or impeller wheel may be spinning at a high speed, for instance, at 4000 RPMs or above, and have significant momentum, due to the mass of the fan or impeller. This action could potentially result in injury to the operator removing the air-moving assembly.

BRIEF SUMMARY

The shortcomings of the prior art are overcome and additional advantages are provided through the provision, in one aspect, of an apparatus which includes a locking louver assembly. The locking louver assembly includes at least one louver, and a locking mechanism. The at least one louver is disposed at one of an air inlet or an air outlet of an air-moving assembly. The air-moving assembly is removable from a chassis within which the air-moving assembly resides when in an operational state, and the louver(s) pivots between an operational orientation and a quiesced orientation, dependent on presence or absence, respectively, of airflow through the air-moving assembly. The locking mechanism includes at least one keying element and at least one key-receiving element. The keying element(s) is affixed to the louver(s) to pivot therewith. One keying element is affixed to one louver of the locking louver assembly, and includes an elongated key oriented in a first direction when the one louver is in the operational orientation, and in a second direction when the one louver is in the quiesced orientation. The at least one key-receiving element is associated with the chassis and includes at least one key opening. One key opening receives and accommodates movement of the elongated key therein, between the first direction and the second direction, and prevents removal of the air-moving assembly from the chassis with the elongated key oriented in the first direction.

In another aspect, an apparatus is provided which includes an air-moving assembly and a locking louver assembly. The air-moving assembly is removable from a chassis within which the air-moving assembly resides when in an operational state, and the locking louver assembly includes at least one louver, and a locking mechanism. The at least one louver is disposed at one of an air inlet or an air outlet of the air-moving assembly, and the louver(s) pivots between an operational orientation and a quiesced orientation, depending on presence or absence, respectively, of airflow through the air-moving assembly. The locking mechanism includes at least one keying element and at least one key-receiving element. The keying element(s) is affixed to the louver(s) to pivot therewith. One keying element is affixed to one louver of the locking louver assembly, and includes an elongated key oriented in a first direction when the one louver is in the operational orientation, and in a second direction when the one louver is in the quiesced orientation. The at least one key-receiving element is associated with the chassis and includes at least one key opening. One key opening receives and accommodates movement of the elongated key therein, between the first direction and the second direction, and prevents removal of the air-moving assembly from the chassis with the elongated key oriented in the first direction.

In a further aspect, a method is provided, which includes: associating a locking louver assembly with an air-moving assembly, the air-moving assembly residing within a chassis when in operational state and being removable from the chassis. The locking louver assembly includes: at least one louver disposed at one of an air inlet or an air outlet of the air-moving assembly, the at least one louver pivoting between an operational orientation and a quiesced orientation, dependent on presence or absence, respectively, of airflow through the air-moving assembly; and a locking mechanism, the locking mechanism including: at least one keying element affixed to the at least one louver to pivot therewith, one keying element of the at least one keying element being affixed to one louver of the at least one louver of the locking louver assembly, and including an elongated key oriented in a first direction when the one louver is in the operational orientation, and in a second direction when the one louver is in the quiesced orientation; and at least one key-receiving element associated with the chassis and comprising at least one key opening, one key opening of the at least one key opening receiving and accommodating movement of the elongated key therein, between the first direction and the second direction, and preventing removal of the air-moving assembly from the chassis with the elongated key oriented in the first direction.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the term "electronics rack" refers to any housing, frame, rack, compartment, blade server system, etc., having one or more heat-generating components of a computer system, electronic system, or information technology (IT) equipment, and may include, for example, a stand-alone computer processing system having high, mid, or low-end processing capability. In one embodiment, an electronics rack may include one or more electronic subsystems, for example, in one or more servers, sub-housings, blades, drawers, nodes, compartments, boards, etc., having one or more heat-generating electronic components disposed therein or thereon. An electronic system or subsystem may be removable or fixed, for example, relative to an electronics rack, with rack-mounted electronic drawers of an electronics rack and blades of a blade-center system being two examples of electronic systems or subsystems of an electronics rack to be cooled. As noted, in one embodiment, an electronic system/subsystem may include, or be, a server unit. Further, as used herein, the term "chassis" or "electronics chassis" refers to any housing, container, frame, rack, compartment, etc., and may be, in one embodiment, an electronics rack, or an electronic subsystem chassis which resides within the electronics rack.

Reference is made below to the drawings, where the same reference numbers used throughout different figures designate the same or similar components.

Figure 1:
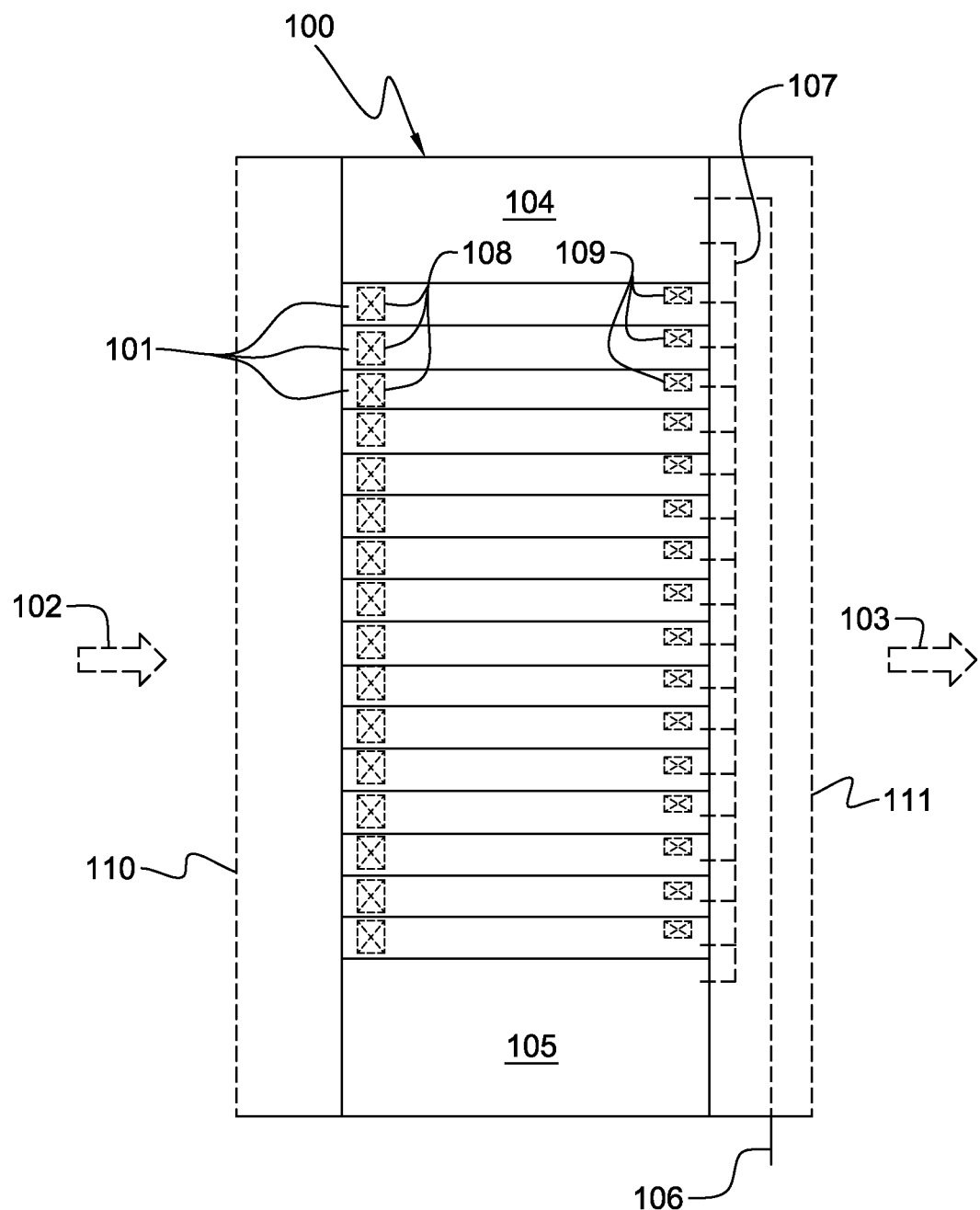
FIG. 1 is an elevational depiction of one embodiment of an electronics rack to incorporate therein one or more apparatuses, in accordance with one or more aspects of the present invention.

FIG. 1 depicts (by way of example) one embodiment of an electronics rack 100 with a plurality of electronic subsystems 101 to be cooled. In the embodiment illustrated, electronic subsystems 101 are air-cooled by cool airflow 102 ingressing via an air inlet 110, and exhausting out an air outlet 111 as hot airflow 103. One or more air-moving assemblies 108 are provided at the air inlet sides of electronic subsystems 101 and/or one or more air-moving assemblies 109 are provided at the air outlet sides of electronic subsystems 101 to facilitate airflow through the individual subsystems 101 as part of the cooling apparatus of electronics rack 100. By way of example, air-moving assemblies 108 at the air inlets to electronic subsystems 101 may be or include axial fan assemblies, and air-moving assemblies 109 disposed at the air outlets of electronic subsystems 101 may be or include centrifugal fan assemblies. One or more of electronic subsystems 101 may include heat-generating components to be cooled of a computer system, electronics system, or information technology (IT) equipment. For instance, one or more of the electronic subsystems 101 may include one or more processors and associated memory.

Electronics rack 100 may also include, by way of example only, one or more bulk power assemblies 104 of an AC to DC power supply assembly. AC to DC power supply assembly further includes, in one embodiment, a frame controller, which may be resident in the bulk power assembly 104 and/or in one or more electronic subsystems 101. Also illustrated in FIG. 1 is one or more input/output (I/O) drawer(s) 105, which may also include a switch network. I/O drawer(s) 105 may include, as one example, PCI slots and disk drivers for the electronics rack.

In implementation, a three-phase AC source feeds power via an AC power supply line cord 106 to bulk power assembly 104, which transforms the supplied AC power to an appropriate DC power level for output via distribution cable 107 to the plurality of electronic subsystems 101 and I/O drawer(s) 105. The number of electronic subsystems installed in the electronics rack is variable, and depends on customer requirements for a particular system. Further, although described with reference to multiple electronic subsystems 101, the air-moving assemblies discussed herein could reside within, for instance, bulk power assembly 104, or I/O drawer(s) 105. Again, the particular electronics rack configuration of FIG. 1 is presented by way of example only, and not by way of limitation.

Figure 2:
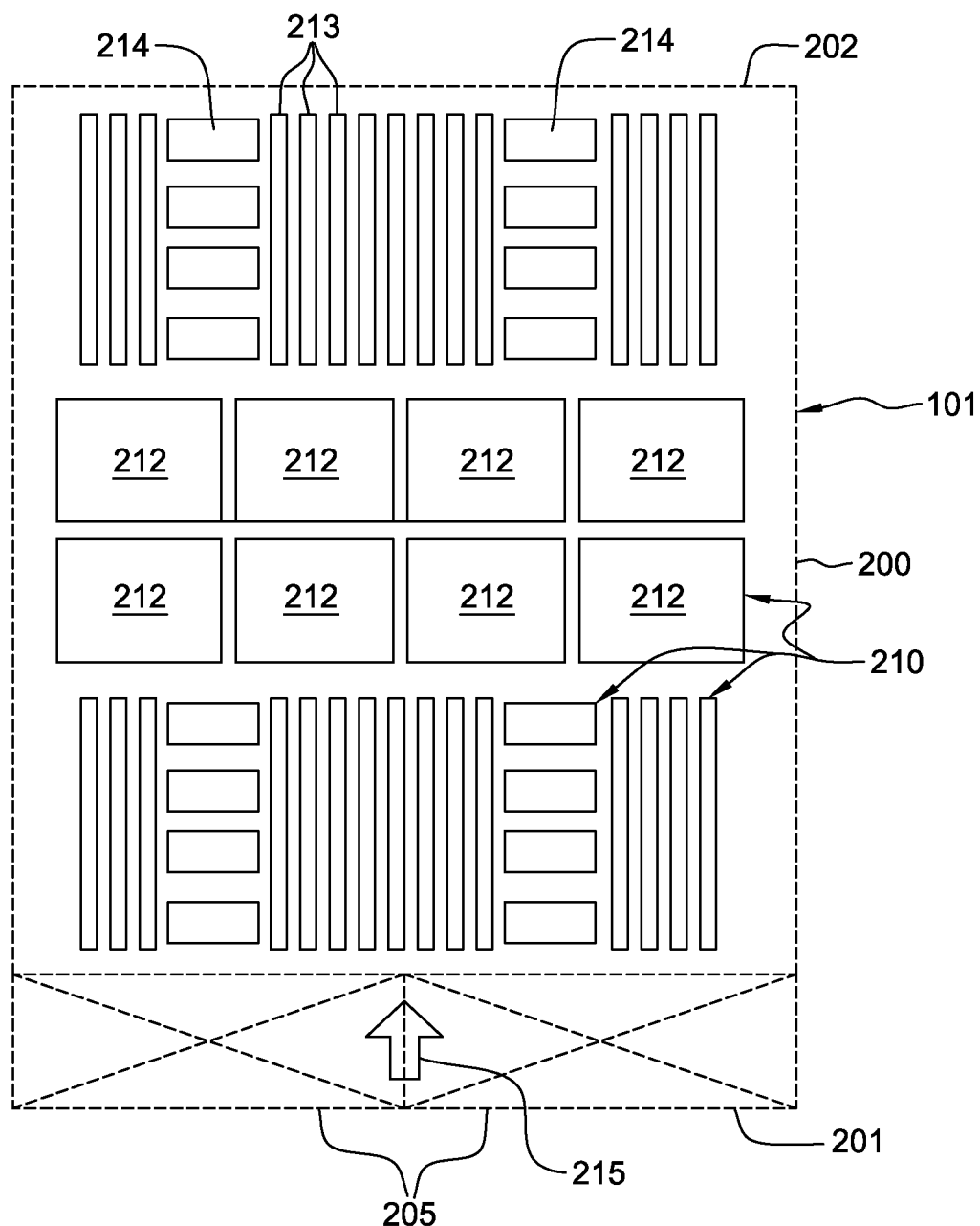
FIG. 2 is a plan view of one embodiment of an electronic subsystem layout illustrating multiple air-moving assemblies at an air inlet side of the electronic subsystem, which may incorporate one or more locking louver assemblies, in accordance with one or more aspects of the present invention.

FIG. 2 depicts one embodiment of an electronic subsystem 101 layout being air-cooled utilizing one air-cooling approach, where one or more air-moving assemblies 205 provide forced airflow 215 in operational state to cool multiple electronic components 210 within electronic subsystem 101. Cool air is taken in through an air inlet 201 and heated air is exhausted out an air outlet 202 of the electronic subsystem. The multiple components 210 to be cooled may include, by way of example, multiple processor modules 212, as well as multiple arrays of memory modules 213 (e.g., dual-in-line memory modules (DIMMs)) and multiple rows of memory support modules 214 (e.g., DIMM control modules). In one implementation, air-cooled heat sinks (not shown) may be coupled to one or more of processor modules 212, memory modules 213, and/or memory support modules 214 to facilitate dissipation of heat therefrom.

In the depicted example of FIG. 2, the air-moving assemblies 205, as well as the electronic components, reside within a chassis 200 containing or supporting the electronic subsystem. Also, as depicted, the air-moving assemblies 205 disposed at the air inlet side 201 of the electronic subsystem may be redundant fan assemblies, which concurrently provide the cooling airflow 215 across or through the electronic components of the electronic subsystem.

Figure 3A:
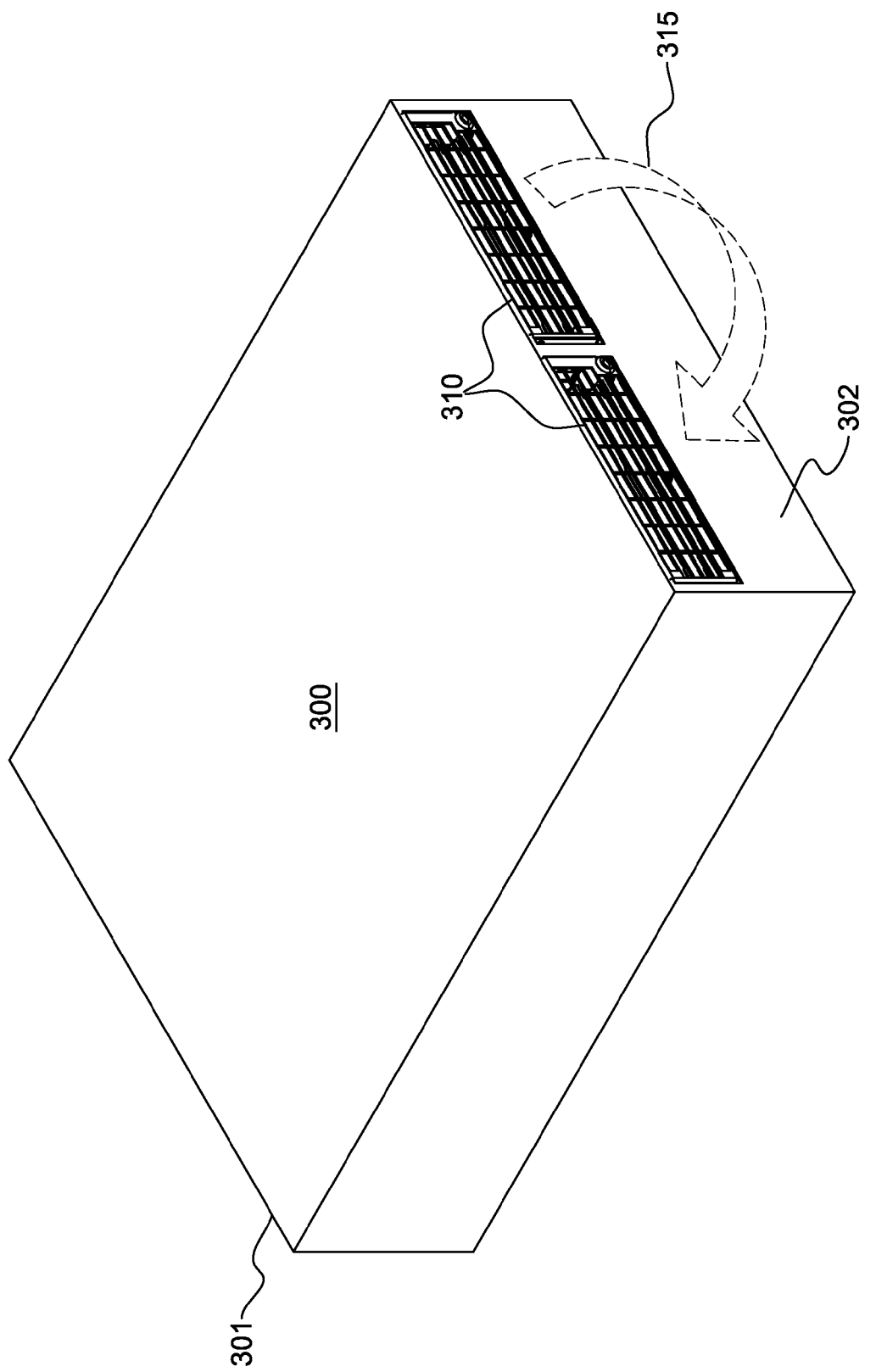
FIG. 3A depicts one embodiment of a chassis with multiple air-moving assemblies disposed at an air outlet side thereof.

FIG. 3A partially depicts an alternate embodiment of an electronic subsystem layout which includes a chassis 300, and redundant air-moving assemblies 310 disposed at an air outlet side 302 of the electronic subsystem, with the air inlet side 301 being, by way of example, at an opposite side of chassis 300. As illustrated in FIG. 3A, assuming that the left air-moving assembly 310 is in a quiesced state, for instance, has been turned off or has failed, then a portion of air egressing from the operating, right air-moving assembly 310 can re-circulate 315 through the left air-moving assembly 310, and be drawn back into the right air-moving assembly 310, potentially significantly reducing the amount of airflow through chassis 300, and thus potentially the cooling of the electronic components of the electronic subsystem.

Figure 3B:
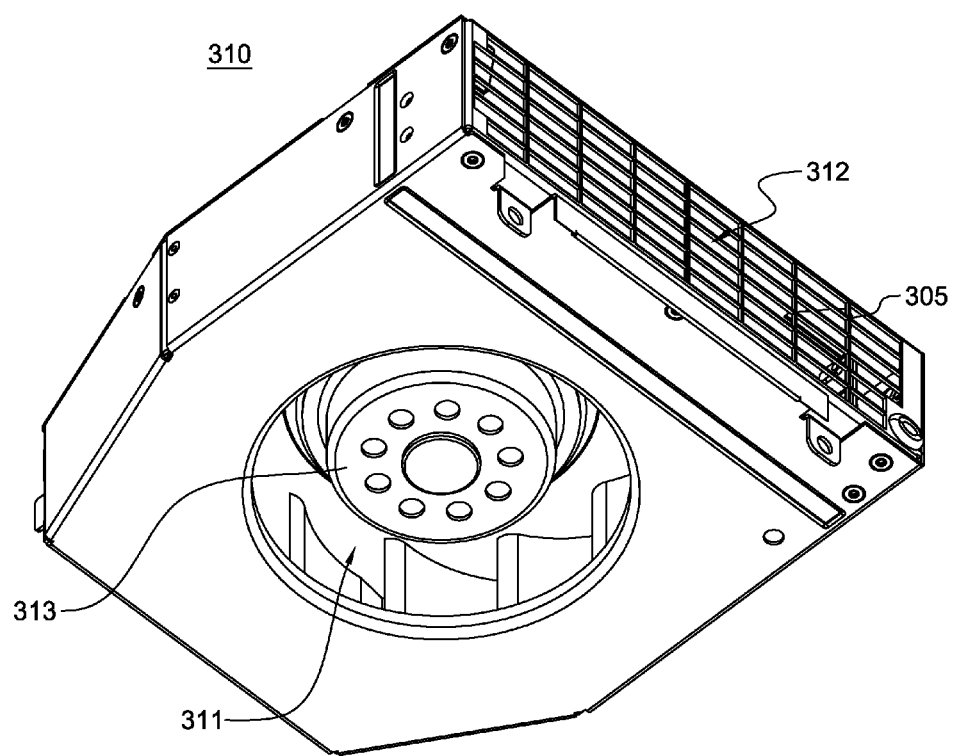
FIG. 3B depicts one embodiment of an air-moving assembly of FIG. 3A, shown removed from the chassis.

FIG. 3B depicts one embodiment of air-moving assembly 310 of FIG. 3A. In this embodiment, air-moving assembly 310 is depicted as a centrifugal fan assembly with a relatively large air inlet opening 311 in a lower surface thereof, exposing the centrifugal blower 313, and an air outlet 312, which may have a grating 305 as a safety feature. As noted above, in many systems today, air-moving assemblies may be designed to be concurrently maintainable, so that one assembly entering into a quiesced state does not significantly impact system cooling, and thus operational availability of computing resources to a customer. In the event that an operating air-moving assembly 310 is mistakenly removed, the fan or impeller wheel may be spinning at a high speed, and has significant momentum due to its mass. This mistake could result in injury to the operator removing the assembly, particularly in a centrifugal fan design such as illustrated in FIG. 3B, where there is a relatively large air inlet 311 within the assembly.

One possible solution to the issue would be to provide a grill with openings smaller than an operator's fingers at the air assembly's inlet. However, this could significantly impede airflow through the assembly. An alternate approach would be to disallow redundancy for concurrent replaceability, which is undesirable, since a customer could experience a computing outage due to a single air-moving assembly transitioning to quiesced state, for instance, due to a failure.

As a solution, disclosed herein are apparatuses and methods which address the above-noted drawbacks to existing concurrently-maintainable, air-moving assemblies. The apparatuses may include, for instance, a locking louver assembly. The locking louver assembly includes at least one louver, and a locking mechanism. The at least one louver is disposed at one of an air inlet or an air outlet of an air-moving assembly, where the air-moving assembly is removable from a chassis within which the air-moving assembly resides when in an operational state. The louver(s) pivots between an operational orientation and a quiesced orientation, dependent on presence or absence, respectively, of airflow through the air-moving assembly. The locking mechanism includes at least one keying element and at least one key-receiving element. The keying element(s) is affixed to the louver(s) to pivot therewith. One keying element is affixed to one louver of the locking louver assembly, and includes an elongated key oriented in a first direction when the one louver is in the operational orientation, and in a second direction when the one louver is in the quiesced orientation. The at least one key-receiving element is associated with the chassis and includes at least one key opening. One key opening receives and accommodates movement of the elongated key therein, between the first direction and the second direction, and prevents removal of the air-moving assembly from the chassis with the elongated key oriented in the first direction.

In one implementation, the one key opening(s) includes a pocket opening(s) sized to receive the elongated key element and allow rotation of the elongated key between the first direction and the second direction.

In another implementation, the key opening(s) may include an insertion-removal slot sized to allow passage of the key element therethrough when in the second direction, to allow removal of the air-moving assembly from the chassis when the air-moving assembly is in a quiesced state. As one example, the one louver may be substantially horizontal when in the operational orientation, and the elongated key substantially vertical in the first direction, with the one louver gravitationally falling to a substantially vertical, quiesced orientation when the air-moving assembly transitions from the operational state to a quiesced state. In this case, the elongated key is substantially horizontal in the second direction and may pass through the insertion-removal slot, and thus allow removal of the air-moving assembly from the chassis.

In certain implementations, the key opening(s) includes both a pocket opening(s) and an insertion-removal slot, with the pocket opening(s) being defined, in part, by an inner wall region, such as a flat inner wall region, wherein the pocket opening(s) connects to the insertion-removal slot. The inner wall region prevents the elongated key from entering the insertion-removal slot when the one louver is in the operational orientation. Note that as used herein, "elongated key" can refer to any of a variety of key shapes or configurations, where a characteristic length of the elongated key in one direction is greater than a characteristic length of the elongated key in another direction.

In certain implementations, the key-receiving element(s) may be part of the chassis, or secured to the chassis. For instance, the key-receiving element(s) may be a block structure affixed to the chassis, with the block structure including multiple key openings, as described herein. Further, the locking mechanism of the locking louver assembly may be provided on one side of the pivotable louver(s), or on both sides of the pivotable louver(s), depending on the implementation. That is, a single louver may have one keying element affixed to a side edge thereof, or two keying elements, on opposite side edges thereof. In one implementation, the key elements are integrated with a pivot, hinge, etc., of the louver which allows pivoting of the louver between the operational orientation and the quiesced orientation, dependent on presence or absence of airflow through the air-moving assembly. As noted above, in one embodiment, the louvers of the locking louver assembly gravitationally drop from the operational orientation to the quiesced orientation when the air-moving assembly transitions from the presence to absence of airflow through the assembly.

The at least one louver and locking mechanism of the locking louver assembly may be disposed at either the air inlet or the air outlet of the air-moving assembly, for instance, dependent on the type of air-moving assembly, that is, whether the assembly includes an axial fan or a centrifugal fan configuration. In one implementation, the air-moving assembly is a centrifugal fan, and the locking louver assembly is disposed at the air outlet of the air-moving assembly.

Advantageously, the louvers of the locking louver assembly operate as anti-recirculation louvers when the air-moving assembly is in quiesced orientation. Further, the locking mechanism of the locking louver assembly prevents removal of the air-moving assembly from the chassis while there is still airflow through the air-moving assembly, that is, sufficient airflow to prevent the louvers from attaining the quiesced orientation. This advantageously prevents removal of the air-moving assembly from the chassis until the rotor of the assembly is below a safe operational speed.

As noted, the keying element(s) associated with the louvers may be on one or both distal ends of one or more louvers, for instance, at, or incorporated as part of, a louver's pivot or hinge axis, and be any elongated shape oriented orthogonal to the elongated louver, such that when the louver is in quiesced orientation, that is, substantially vertical commensurate with low speed or stopped rotation of the rotor, the keying element(s) is in a horizontal orientation, and when the louver is in a substantially horizontal orientation, that is, commensurate with an operational state of the air-moving assembly, the keying element(s) is in a vertical orientation. The key-receiving element(s), which may be part of the chassis, or affixed to the chassis within which the air-moving assembly resides when in operational state, includes a key opening(s) specifically configured with a pocket opening(s) and an insertion-removal slot. The pocket opening(s) is sized to accommodate rotation of the key feature as the associated louver(s) moves between operational orientation and quiesced orientation, responsive to airflow changes through the assembly. The flat inner wall portion of the pocket opening adjacent to the insertion-removal slot prevents the elongated key from sliding into the slot if the louvers are in operational orientation. The insertion-removal slot is sized to accommodate sliding of the elongated key feature through the slot when the louver is in quiesced orientation, for instance, to allow an operator to remove the air-moving assembly from the chassis.

Figure 4A:
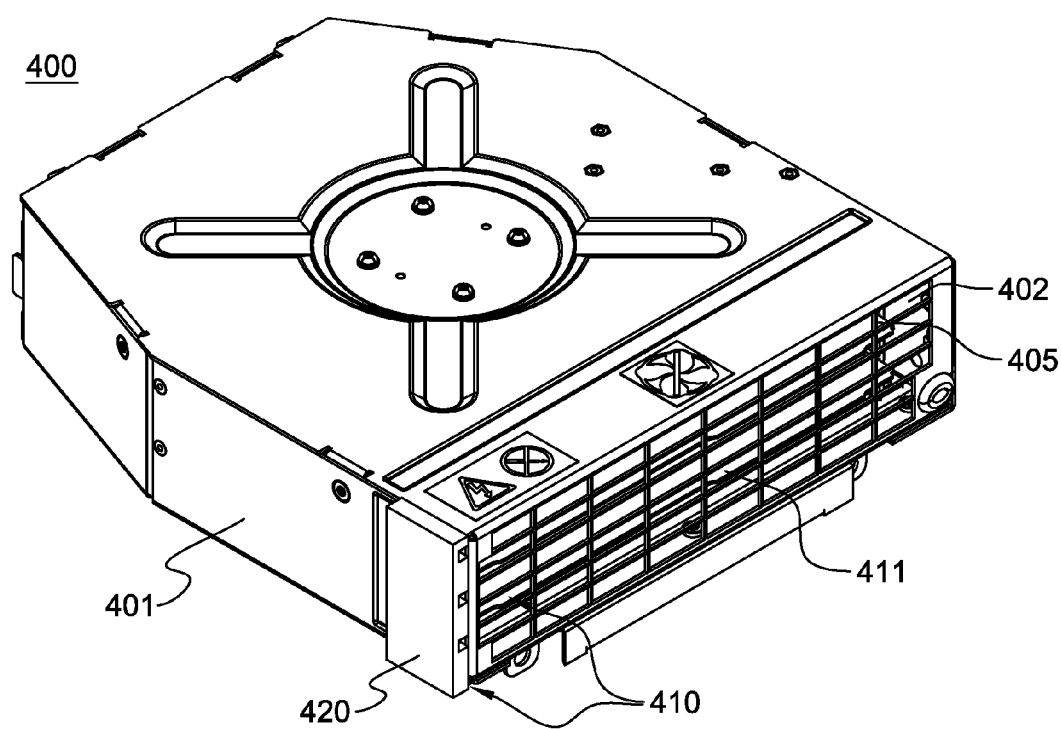
FIG. 4A depicts one embodiment of an apparatus comprising an air-moving assembly and a locking louver assembly, in accordance with one or more aspects of the present invention.
Figure 4B:
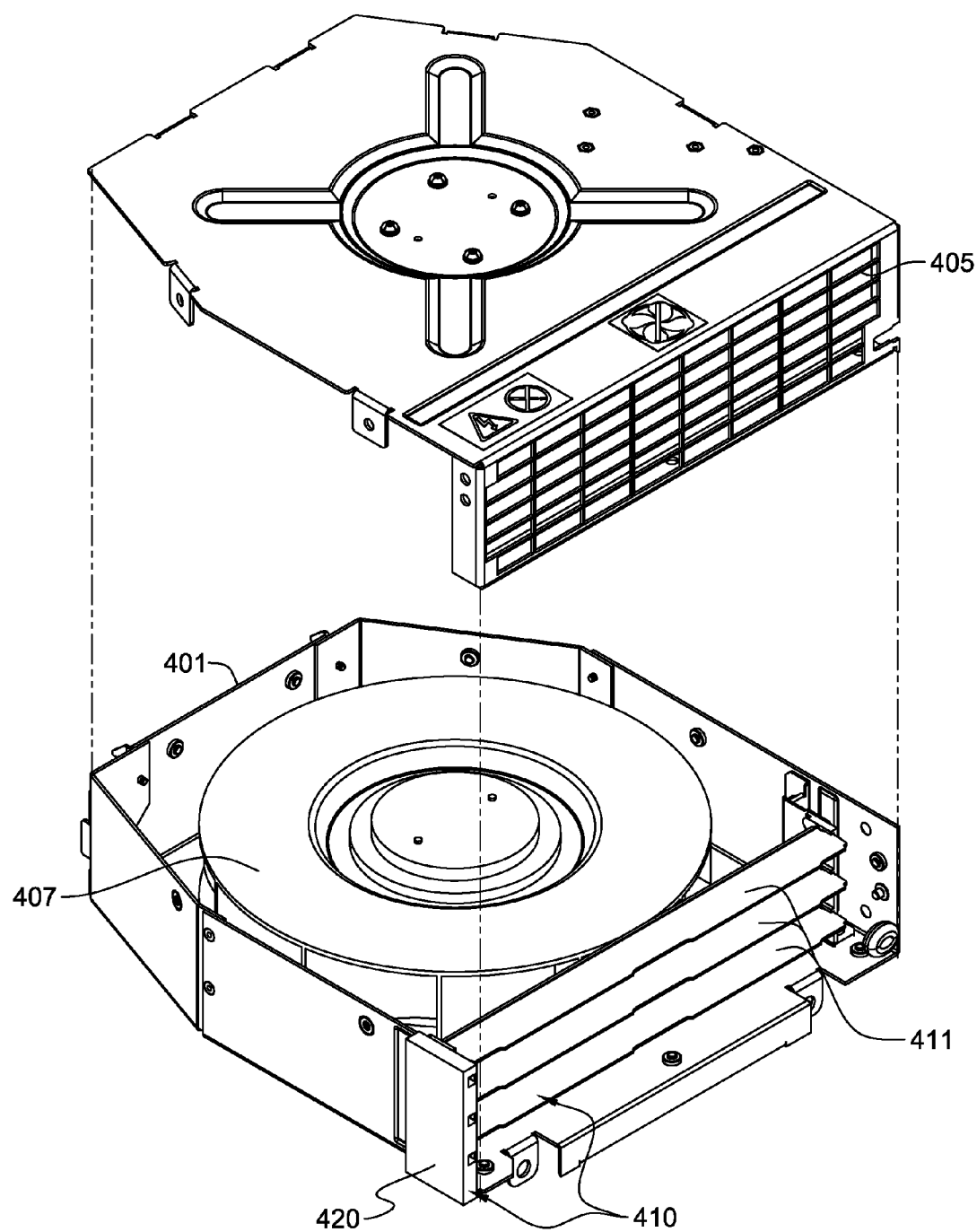
FIG. 4B is a partially-exploded depiction of the apparatus of FIG. 4A, with the cover and outer grating exploded from the apparatus to illustrate one embodiment of the locking louver assembly thereof, in accordance with one or more aspects of the present invention.

FIGS. 4A & 4B depict one embodiment of an apparatus 400, in accordance with one or more aspects of the present invention. Apparatus 400 includes an air-moving assembly 401, such as air-moving assembly 310 described above in connection with FIG. 3B, and a locking louver assembly 410, which includes in the depicted embodiment multiple louvers 411 and a locking mechanism comprising one or more key-receiving elements 420. In this embodiment, the air-moving assembly 401 is implemented as a centrifugal fan 407, which may be disposed, for instance, at the air outlet side of an electronic subsystem, such as within one of the electronic subsystems 101 described above in connection with FIG. 1. As noted, in this configuration, air is drawn in through an air inlet in a lower surface of the air-moving assembly and expelled through an air outlet 402, which may include a protective grid or grating 405.

Although depicted herein with multiple louvers 411, the locking louver assembly 410 could include one or more louvers, as desired for a particular configuration. Louvers 411 are illustrated in FIGS. 4A & 4B in an operational orientation (which in this implementation, is substantially horizontal) that assumes air-moving assembly 401 is in an operational state. In particular, in the operational orientation depicted in FIGS. 4A & 4B, the centrifugal fan rotor is assumed to be spinning at an operational speed sufficient to impel an airflow through louvers 411 at a speed which overcomes the weight of the louvers acting on the louver-hinge axis such that the louvers are maintained substantially horizontal, as depicted in the figures. Should the air-moving assembly be turned off, or fault, and thereby enter a quiesced state where there is little or no airflow moving through the assembly 401, then the louvers 411 drop to a quiesced orientation, where the louvers are substantially vertical, advantageously preventing any recirculation of air back through the quiesced air-moving assembly. Note that in an alternate implementation, where the air-moving assembly is disposed at the air inlet side of an electronic subsystem, then the hinged louvers may pivot inwardly when transitioning from, for instance, a quiesced orientation to an operational orientation.

Figure 4C:
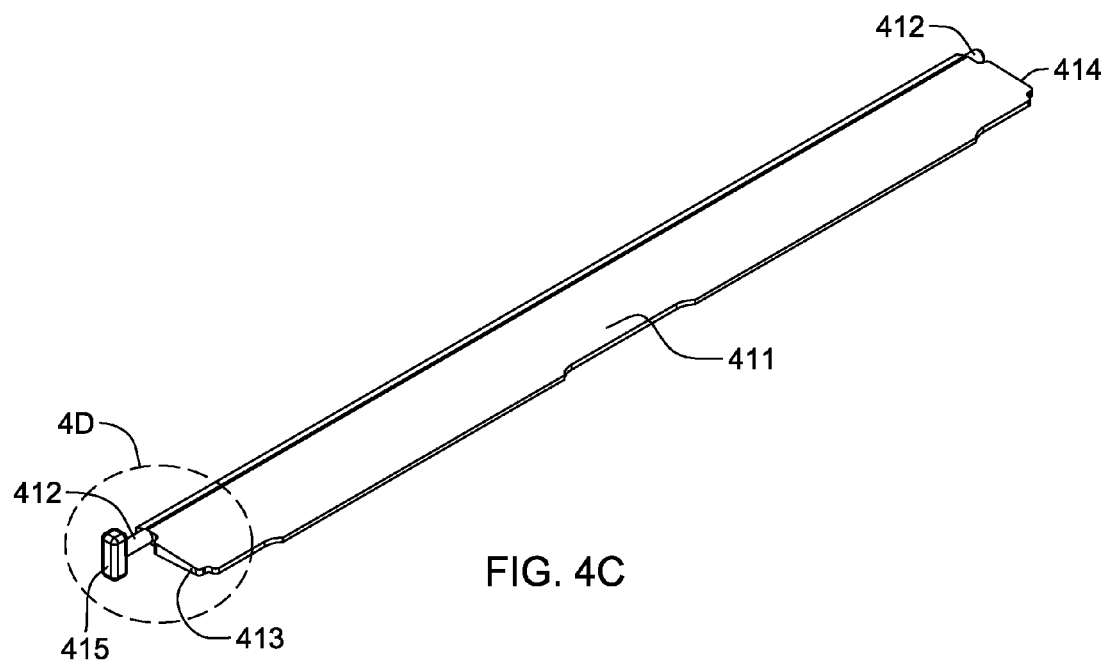
FIG. 4C depicts one embodiment of a louver and keying element of a locking louver assembly, in accordance with one or more aspects of the present invention.
Figure 4D:
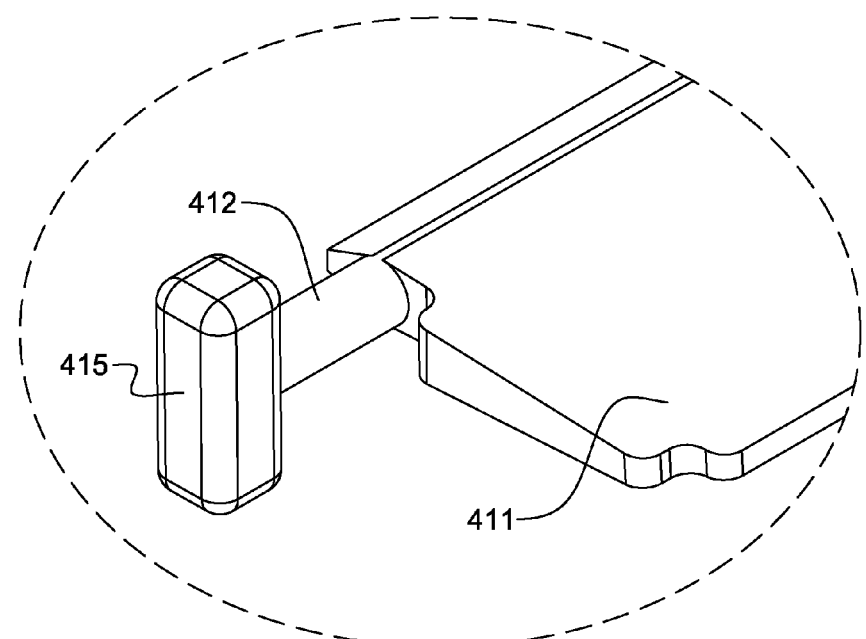
FIG. 4D is an enlarged partial depiction of the louver and keying element of FIG. 4C, in accordance with one or more aspects of the present invention.

FIGS. 4C & 4D depict one embodiment of a louver 411 which includes a hinge or pivot axis 412 and has a keying element 415 disposed at an end 413 of the louver, for instance, integrated with hinge axis 412. Note that in another embodiment, the opposite end 414 of louver 411 could also have a keying element 415, that is, if the locking mechanism on both sides of the louver(s) is desired. In the depicted embodiment, keying element 415 is an elongated key, which has a characteristic dimension in one direction longer than that in another direction, such that the key shape is elongated. Note that the rectangular block configuration illustrated in FIGS. 4C & 4D is presented by way of example only, and that other elongated key configurations may be employed. Also, although described herein as keying elements attached to or integrated with each louver, only one louver of multiple louvers may have the locking mechanism described, and still advantageously prevent removal of the air-moving assembly from the chassis when in operational state.

When the louvers 411 are in the operational orientation illustrated in FIGS. 4A & 4B, then as shown in FIGS. 4C & 4D, elongated keys 415 are oriented in a first direction, which is substantially orthogonal to the operational orientation of the louvers 411. That is, in the embodiment depicted, the first direction of elongated key 415 is substantially vertical.

Figure 4E:
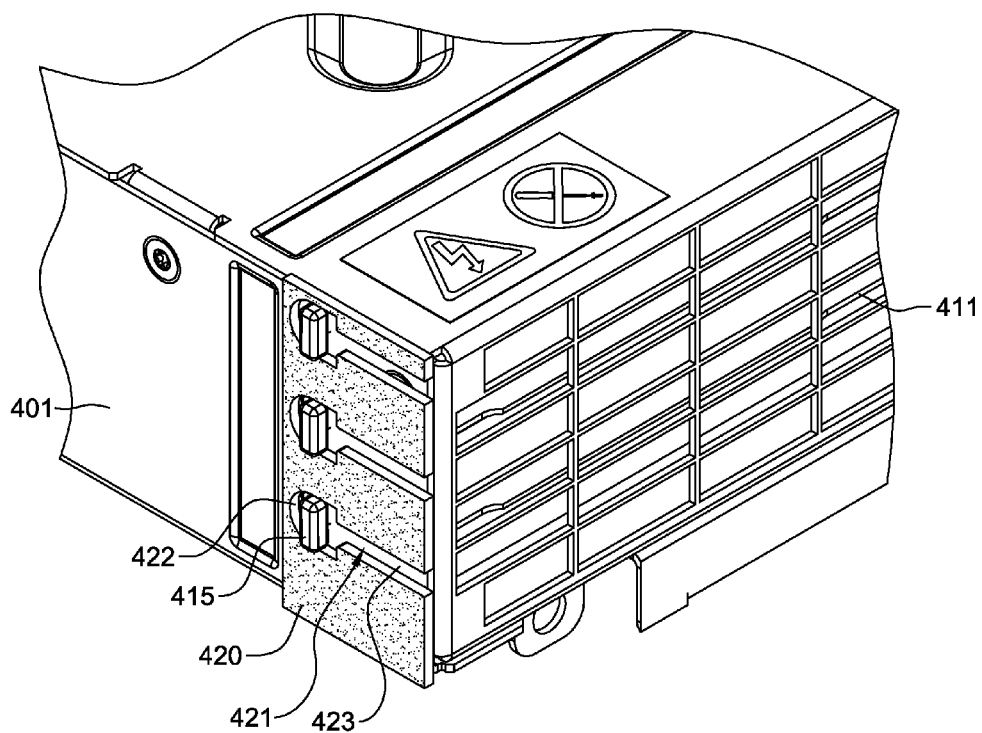
FIG. 4E is a partial, enlarged depiction of the apparatus of FIGS. 4A-4D, with one embodiment of the key-receiving element shown in cross-section, and the louvers of the locking louver assembly shown in operational orientation, with the elongated keys oriented in a first direction which prevents removal of the air-moving assembly from the chassis, in accordance with one or more aspects of the present invention.

As illustrated in FIG. 4E, elongated keys 415 are received within respective key openings 421 in key-receiving element 420, which is part of, or attached to, the chassis within which the air-moving assembly is operationally positioned, such as chassis 300 in the embodiment of FIG. 3A. Note that key-receiving element 420 remains affixed or part of the chassis, notwithstanding removal of the air-moving assembly positioned within the chassis.

In the depicted embodiment, the key openings 421 include a pocket opening 422 and an insertion-removal slot 423. The respective pocket openings 422 are sized and configured to allow for rotation of the respective elongated keys 415 between the depicted first direction, and a second direction where the elongated keys are substantially horizontal.

Figure 4F:
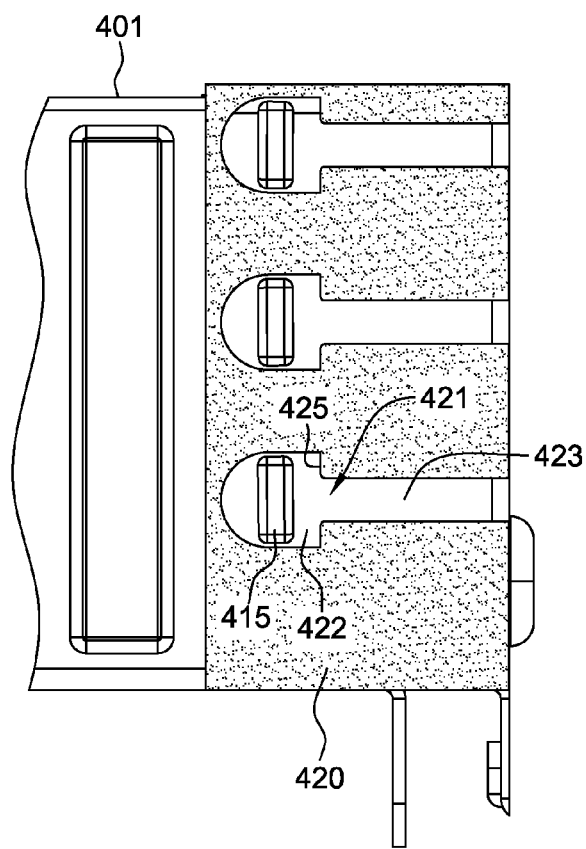
FIG. 4F is a partial elevational view of the apparatus of FIG. 4E, illustrating the elongated keys in the first direction, when the air-moving assembly is in the operational state, in accordance with one or more aspects of the present invention.
Figure 4G:
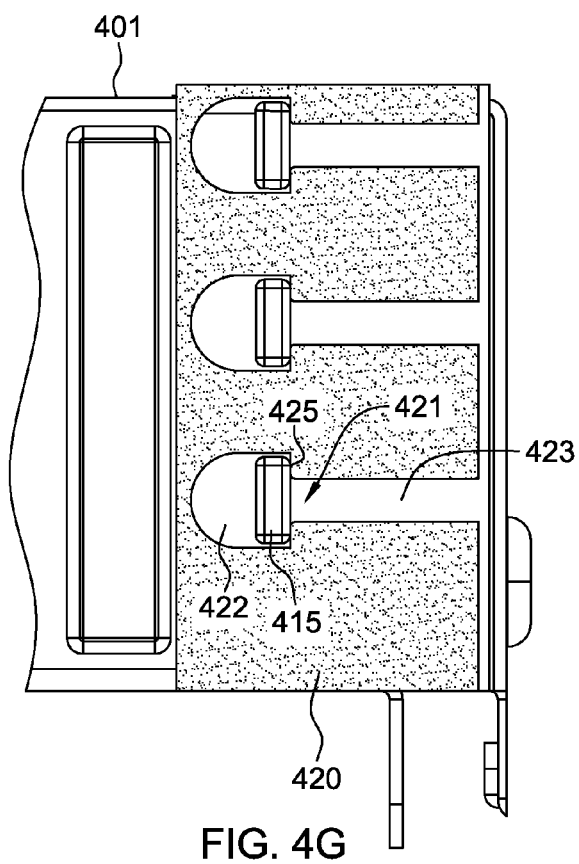
FIG. 4G is a partial elevational view of the apparatus of FIG. 4E, showing the elongated keys engaging a flat inner wall region of the respective pocket openings, which prevents removal of the air-moving assembly from the chassis when in the operational state, in accordance with one or more aspects of the present invention.

FIGS. 4F & 4G depict side elevational view of the apparatus of FIG. 4E, with the elongated keys 415 of the locking mechanism shown in the first direction, for instance, the substantially vertical direction. In this orientation, elongated keys 415 are unable to enter the insertion-removal slots 423, being engaged by a flat inner wall region 425 of the pocket openings 422 adjacent to insertion-removal slots 423. Thus, as illustrated in FIG. 4G, the air-moving assembly is unable to be withdrawn from the chassis, being locked in position by the locking mechanism of the locking louver assembly.

Figure 5A:
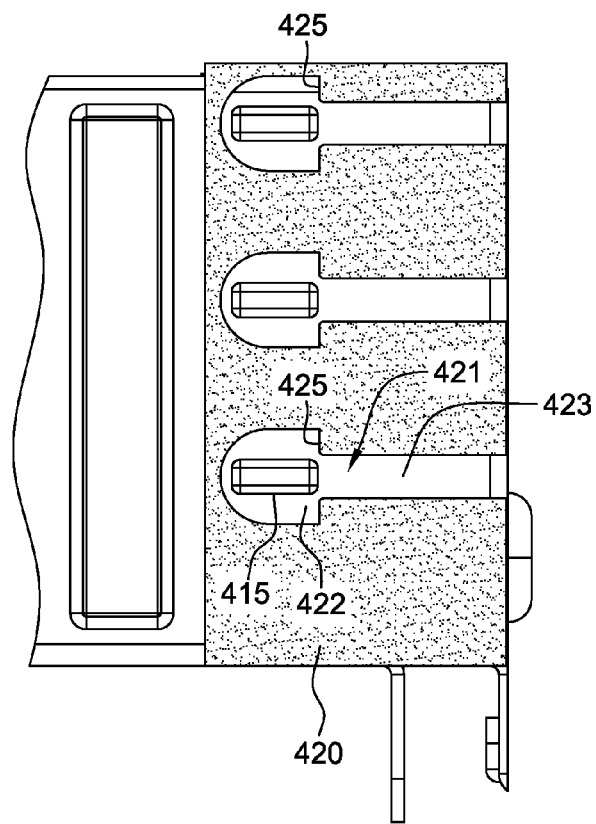
FIG. 5A is a partial elevational depiction of the apparatus of FIGS. 4A-4G, with the elongated keys shown oriented in the second direction, which allows for the elongated keys to slide through insertion-removal slots of the respective key openings of the key-receiving element, in accordance with one or more aspects of the present invention.
Figure 5B:
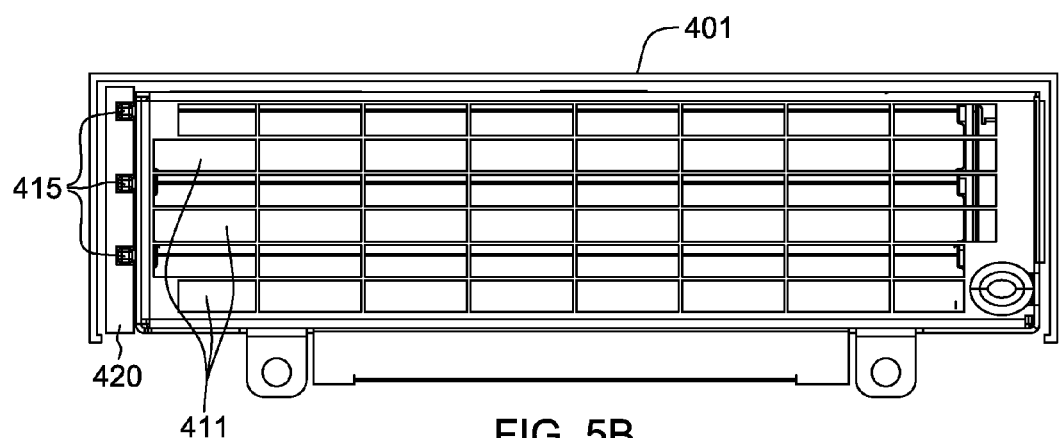
FIG. 5B is a front elevational depiction of the apparatus of FIGS. 4A-5A, with the louvers shown in the quiesced orientation, and the corresponding elongated keys oriented in the second direction, in accordance with one or more aspects of the present invention.
Figure 5C:
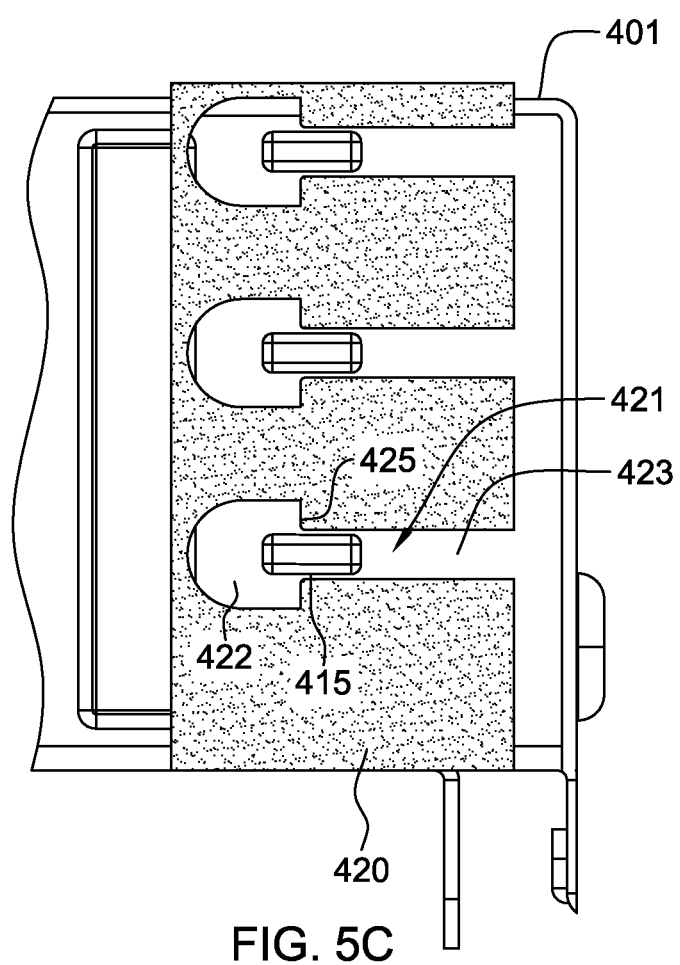
FIG. 5C is a partial elevational depiction of the apparatus of FIGS. 5A & 5B, with the air-moving assembly shown being withdrawn from the chassis, and the elongated keys sliding through insertion-removal slots of the respective key openings, in accordance with one or more aspects of the present invention.

FIGS. 5A-5C depict the apparatus of FIGS. 4A-4G, with the louvers 411 shown in quiesced orientation in FIG. 5B, that is, substantially vertical, to close off the air outlet side of the air-moving assembly. As illustrated in FIGS. 5A & 5C, with the louvers 411 in quiesced orientation, the elongated keys 415, which (in one embodiment) are oriented orthogonal to the louvers, are substantially horizontal, as shown. In this orientation, the elongated keys 415 align with the insertion-removal slots 423, and the air-moving assembly may be removed from the chassis, for instance, for maintenance or replacement, as illustrated in FIG. 5C.

Figure 6:
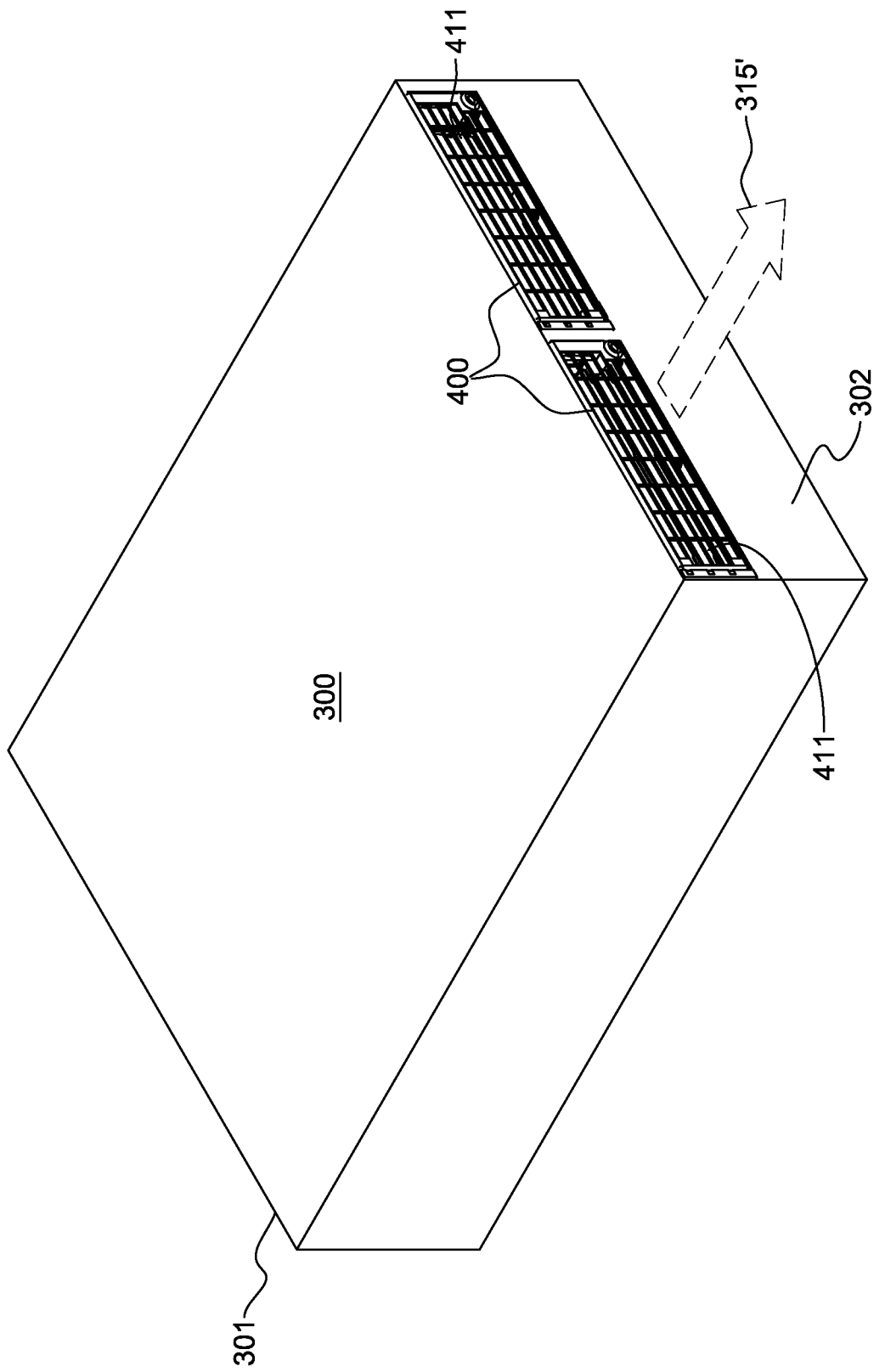
FIG. 6 depicts one embodiment of two air-moving and locking louver assemblies disposed side-by-side within a chassis, with one air-moving assembly shown in operational state, and the other air-moving assembly shown in quiesced state, in accordance with one or more aspects of the present invention.

FIG. 6 depicts the electronic subsystem chassis 300 of FIG. 3, with the apparatus 400 of FIGS. 4A-5C. In this depiction, the left-most air-moving assembly is assumed to be operational, with airflow 315' egressing across the respective louvers 411 in operational orientation, and the right-most air-moving assembly is assumed to be in quiesced state, with the louvers 411 of that apparatus shown in quiesced orientation, substantially vertical, thereby blocking any recirculation of egressing airflow 315' back into chassis 300, through the quiesced air-moving assembly. Thus, the locking louver assembly, in addition to providing the above-described locking facility for preventing removal of the air-moving assembly when airflow is passing through the assembly, also prevents recirculation of egressing airflow from one assembly back into the chassis through a quiesced assembly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
   a locking louver assembly, the locking louver assembly comprising:
      at least one louver coupled to and disposed at one of an air inlet or an air outlet of an air-moving assembly, the air-moving assembly being removable from a chassis within which the air-moving assembly resides when in an operational state, and the at least one louver pivoting between an operational orientation and a quiesced orientation, dependent on presence or absence, respectively, of airflow through the air-moving assembly; and
   a locking mechanism, the locking mechanism comprising:
      at least one keying element affixed to the at least one louver to pivot therewith, one keying element of the at least one keying element being affixed to one louver of the at least one louver at a pivot axis thereof, and comprising an elongated key extending transverse to the pivot axis, the elongated key being oriented in a first direction when the one louver is in the operational orientation, and in a second direction when the one louver is in the quiesced orientation; and
      at least one key-receiving element associated with the chassis and comprising at least one key opening, one key opening of the at least one key opening receiving and accommodating movement of the elongated key therein between the first direction and the second direction, wherein the one key opening of the at least one key opening comprises an inner wall region, and wherein the air-moving assembly is prevented from being removed from the chassis by the elongated key oriented in the first direction contacting the inner wall region of the one key opening.

2. The apparatus of claim 1, wherein the one key opening comprises a pocket opening sized to receive the elongated key element and allow rotation of the elongated key between the first direction and the second direction.

3. The apparatus of claim 1, wherein the one key opening comprises a insertion-removal slot sized to allow passage of the elongate key there through when oriented in the second direction to allow removal of the air-moving assembly from the chassis when the air-moving assembly is in a quiesced state.

4. The apparatus of claim 1, wherein the one key opening comprises a pocket opening and an insertion-removal slot, the pocket opening connects to the insertion-removal slot, the inner wall region preventing the elongated key from entering the insertion-removal slot when the one louver is in the operational orientation.

5. The apparatus of claim 1, wherein the one louver is substantially horizontal when in the operational orientation, and the elongated key is substantially vertical in the first direction.

6. The apparatus of claim 5, wherein the one louver gravitationally drops to a substantially vertical, quiesced orientation when the air-moving assembly transitions from the operational state to a quiesced state, and the elongated key is substantially horizontal in the second direction.

7. The apparatus of claim 1, wherein the at least one key-receiving element is one of part of the chassis or secured to the chassis.

8. The apparatus of claim 1, wherein the at least one key-receiving element comprises a block structure affixed to the chassis.

9. The apparatus of claim 1, wherein the at least one louver is hingedly coupled to the air-moving assembly at one of the air inlet or the air outlet thereof.

10. The apparatus of claim 1, wherein the air-moving assembly comprises a centrifugal fan, and the at least one louver is hingedly coupled to the air-moving assembly at the air outlet thereof.

11. An apparatus comprising:
an air-moving assembly residing within a chassis when in an operational state, the air-moving assembly being removable from the chassis; and
a locking louver assembly, the locking louver assembly comprising:
at least one louver coupled to and disposed at one of an air inlet or an air outlet of the air-moving assembly, the at least one louver pivoting between an operational orientation and a quiesced orientation, dependent on presence or absence, respectively, of airflow through the air-moving assembly; and
a locking mechanism, the locking mechanism comprising:
at least one keying element affixed to the at least one louver to pivot therewith, one keying element of the at least one keying element being affixed to one louver of the at least one louver at a pivot axis thereof, and comprising an elongated key extending transverse to the pivot axis, the elongated key being oriented in a first direction when the one louver is in the operational orientation, and in a second direction when the one louver is in the quiesced orientation; and
at least one key-receiving element associated with the chassis and comprising at least one key opening, one key opening of the at least one key opening receiving and accommodating movement of the elongated key therein, between the first direction and the second direction, wherein the one key opening of the at least one key opening comprises an inner wall region, and wherein the air-moving assembly is prevented from being removed from the chassis by the elongated key oriented in the first direction contacting the inner wall region of the one key opening.

12. The apparatus of claim 11, wherein the chassis further comprises one or more electronic components to be cooled, at least in part, by the airflow through the air-moving assembly when in the operational state.

13. The apparatus of claim 11, wherein the one key opening comprises a pocket opening sized to receive the elongated key element and allow rotation of the elongated key between the first direction and the second direction.

14. The apparatus of claim 11, wherein the one key opening comprises a insertion-removal slot sized to allow passage of the elongate key there through when oriented in the second direction to allow removal of the air-moving assembly from the chassis when the air-moving assembly is in a quiesced state.

15. The apparatus of claim 11, wherein the one key opening comprises a pocket opening and an insertion-removal slot, where the pocket opening connects to the insertion-removal slot, the inner wall region preventing the elongated key from entering the insertion-removal slot when the one louver is in the operational orientation.

16. The apparatus of claim 11, wherein the one louver is substantially horizontal when in the operational orientation, and the elongated key is substantially vertical in the first direction.

17. The apparatus of claim 16, wherein the one louver gravitationally drops to a substantially vertical, quiesced orientation when the air-moving assembly transitions from the operational state to a quiesced state, and the elongated key is substantially horizontal in the second direction.

18. The apparatus of claim 11, wherein the at least one louver is hingedly coupled to the air-moving assembly at one of the air inlet or the air outlet thereof.

19. The apparatus of claim 11, wherein the air-moving assembly comprises a centrifugal fan, and the at least one louver is hingedly coupled to the air-moving assembly at the air outlet thereof.

* * * * *